(12) United States Patent
Davidovich (10) Patent No.: US 10,193,378 B2
(45) Date of Patent: Jan. 29, 2019

(54) APPARATUS AND METHODS FOR CONTROL OF POWER FLOW AND BATTERY CHARGE

(71) Applicant: Hilos Ventures, LLC, Cheyenne, WY (US)

(72) Inventor: Stevan Davidovich, San Carlos, CA (US)

( * ) Notice: Subject to any disclaimer, the term of this patent is extended or adjusted under 35 U.S.C. 154(b) by 157 days.

(21) Appl. No.: 15/503,838

(22) PCT Filed: Aug. 12, 2015

(86) PCT No.: PCT/US2015/044933
§ 371 (c)(1),
(2) Date: Feb. 14, 2017

(87) PCT Pub. No.: WO2016/025653
PCT Pub. Date: Feb. 18, 2016

(65) Prior Publication Data
US 2017/0237283 A1    Aug. 17, 2017

Related U.S. Application Data

(60) Provisional application No. 62/038,173, filed on Aug. 15, 2014.

(51) Int. Cl.
| | |
|---|---|
| *H02J 7/35* | (2006.01) |
| *H01L 31/04* | (2014.01) |
| *H02S 50/00* | (2014.01) |
| *H02S 40/38* | (2014.01) |
| *H02J 3/38* | (2006.01) |
| *H02J 7/00* | (2006.01) |

(52) U.S. Cl.
CPC .............. *H02J 7/35* (2013.01); *H01L 31/04* (2013.01); *H02J 3/385* (2013.01); *H02J 7/0047* (2013.01); *H02S 40/38* (2014.12); *H02S 50/00* (2013.01); *H02J 2007/005* (2013.01)

(58) Field of Classification Search
CPC ... G06F 19/20; G06F 19/203; G06Q 20/1085; G06Q 20/16; H02J 7/35; H02J 3/385; H02J 7/0047; H02J 2007/005; H02S 50/00; H02S 40/38; H01L 31/04
USPC ............................ 235/379, 38, 487, 488, 492
See application file for complete search history.

(56) References Cited

U.S. PATENT DOCUMENTS

| 2009/0027001 A1 | 1/2009 | Haines |
| 2011/0291480 A1 | 12/2011 | Nair et al. |

(Continued)

FOREIGN PATENT DOCUMENTS

WO    2014062170 A1    4/2014

*Primary Examiner* — Robert Deberadinis
(74) *Attorney, Agent, or Firm* — United IP Counselors, LLC (57) ABSTRACT

Systems and methods for controlling a solar panel or solar panel array to power one or more appliances are disclosed. The systems include at least a solar panel or solar panel array, an appliance or electrical load, and a power controller connected between the solar panel or solar panel array and the electrical load. The controller performs a maximum power point tracking (MPPT) algorithm on the solar panel or array. The controller also takes into account contextual information, including location and time information, and allows the battery to be discharged beyond a defined threshold only if the contextual information indicates that sufficient solar power will be available to recharge it.

19 Claims, 5 Drawing Sheets

(56) References Cited

U.S. PATENT DOCUMENTS

2012/0091968 A1 4/2012 Heo et al.
2013/0300449 A1 11/2013 Nakamura et al.

APPARATUS AND METHODS FOR CONTROL OF POWER FLOW AND BATTERY CHARGE

TECHNICAL FIELD

In general, the invention relates to apparatus and methods for control of power flow and battery charge in power generation.

BACKGROUND OF THE INVENTION

Energy production from renewable sources—primarily solar, wind, and geothermal—continues to increase in importance as conventional fossil fuel energy sources become less abundant and concerns about carbon dioxide and other products of combustion grow. Renewable energy production is particularly important for areas of the world where power distribution infrastructure is not fully developed.

Renewable energy production involves myriad technological challenges. One of the most fundamental challenges is that renewable energy production is usually not constant or at a steady rate. For example, the amount of power produced by a solar panel will vary with the latitude, the time of day, the inclination of the panels relative to the sun, the weather, the age of the panels, and other factors. For that reason, most renewable energy production systems include some kind of battery or batteries to store power as it is produced and to allow it to be used at other times.

As chemical repositories of energy, batteries have their own difficulties. Most types of batteries do not respond well to frequent charge-discharge cycles. Lithium ion batteries, which are popular in consumer electronics, have a high energy density and can withstand repeated charge-discharge cycles, but are susceptible to the memory effect, and are also expensive. Lead-acid batteries, by contrast, are ubiquitous (they are used in automobiles), but can begin to oxidize and may suffer permanent damage if they are allowed to fully discharge.

If renewable energy production is to reach its full potential, better technologies for maintaining battery condition and charge, for providing power at more constant voltage and current levels, and for managing appliances connected to non-constant power sources are needed.

SUMMARY OF THE INVENTION

One aspect of the invention relates to a power system. The power system can draw power from any number and type of power sources, and is particularly useful with renewable energy sources, like solar panel arrays, that produce variable, context-dependent amounts of power. The system includes one or more power sources, a power controller, batteries, and one or more appliances connected to the power controller to receive power. The power controller regulates both the input power from the power sources and the output power to the appliances, and also controls battery charging and discharge. The power controller may be specifically adapted to operate with direct current (DC).

Another aspect of the invention relate to methods for controlling power generation from power sources that produce variable, context-dependent amounts of power. These power sources may be, for example, solar panel arrays. The methods involve gathering contextual information, like the time of day, the location of the power system, the sunrise and sunset times, the local weather, and other such information. Using that contextual information, context-aware maximum power point tracking (MPPT) algorithms are implemented to maximize the power produced by the solar panel arrays.

Yet another aspect of the invention relates to methods for controlling battery charging and use in power generation systems. These methods seek to maintain the batteries in good condition and may, for example, maintain the batteries above a predefined threshold level of charge. To do this, the methods may use contextual information. In these methods, an appliance may be permitted to draw the batteries down below the threshold level of charge only if sufficient power is available to recharge the batteries. For example, using a solar panel array, an appliance may be permitted to draw the batteries down to below the predefined threshold only during the day, when sufficient daylight remains to recharge them using the solar panel array, or only when AC grid power, or another power source, is available for recharging the batteries. These kinds of methods allow less expensive, ubiquitous types of batteries, like lead-acid batteries, to be used in these applications.

Other aspects, features, and advantages of the invention will be set forth in the description that follows.

BRIEF DESCRIPTION OF THE DRAWINGS

The invention will be described with respect to the following drawing figures, in which like numerals represent like elements throughout the figures, and in which.

DETAILED DESCRIPTION

Figure 1:
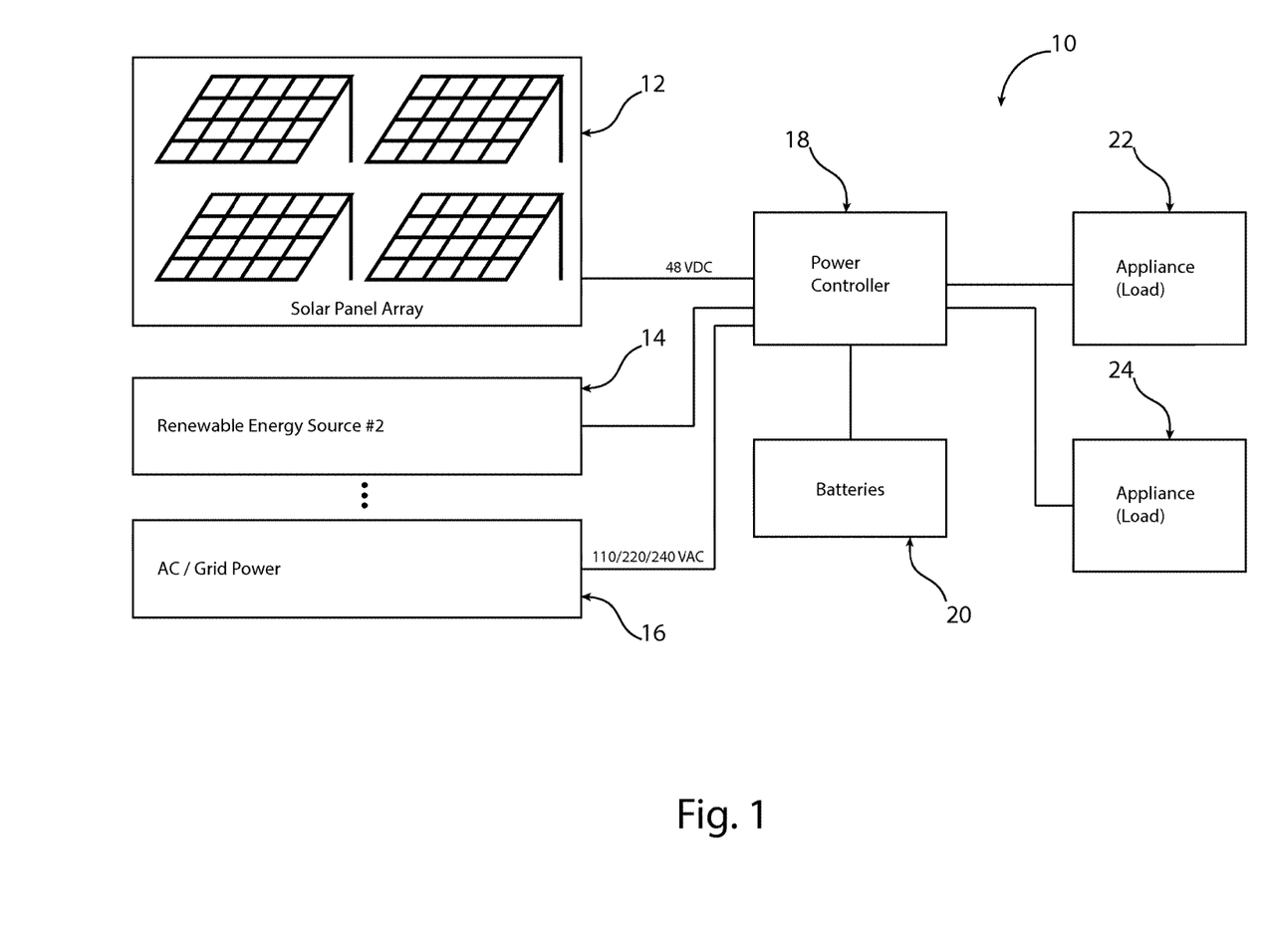
FIG. 1 is an illustration of a solar power system including a power controller according to one embodiment of the invention.

FIG. 1 is an illustration of a power system, generally indicated at 10, according to one embodiment of the invention. In the power system 10, a number of power sources 12, 14, 16 are connected to a power controller 18. The power controller 18 is connected to a battery or a number of batteries 20 and also to appliances or loads 22, 24 that are to be powered.

In the power system 10, some of the power sources 12, 14 may be renewable energy sources (e.g., solar panels, wind turbines, etc.) that provide variable amounts of power, while other sources, like power source 16, may be more constant, like alternating current (AC) power from a conventional power grid. One particular advantage of the power system 10 and the power controller 18 is that the source of the power is not critical; the power controller 18 can handle essentially any power source. There may also be any number of power sources in the power system 10, although only three power sources 12, 14, 16 are shown for the sake of simplicity.

For purposes of description, it will be assumed in the following that the power source 12 is a solar panel array that outputs a variable direct current (DC) voltage, the power source 14 is another renewable energy source that outputs a variable DC or AC voltage, and that the power source 16 is AC power from a conventional power grid, which may be 110, 220, or 240 VAC, depending on the region of the world.

The batteries 20 may be any type of batteries, including nickel-cadmium, nickel-metal hydride, lead-acid, and lithium ion, depending on the application. However, some portions of this description will assume that the batteries are lead-acid batteries, which may be advantageous because of their ubiquity and low cost. In general, one advantage of the power system 10 is the ability to provide power in areas where grid power may not be readily available or reliable.

As was described briefly above, the batteries 20 are powered and charged by the various power sources 12, 14, 16 under control of the power controller 18, and the power controller 18 and batteries 20 provide power for the appliances or loads 22, 24. The appliances or loads 22, 24 may be any devices requiring power; in some cases, the power system 10 may supply power for an entire home or a set of homes. However, in portions of this description, the appliance will be assumed to be an air conditioning unit. The air conditioning unit may be adapted to draw DC power, and, to that end, may have DC compressors, motors, and blowers. In that case, the general objective of the power controller 18 is to power the air conditioner as much as possible using the solar panel array 12 while preserving battery capacity, function, and lifetime. As a practical matter, using lead-acid batteries, that means preventing the batteries 20 from being completely discharged, typically by maintaining them at a predetermined minimal level of charge.

Figure 2:
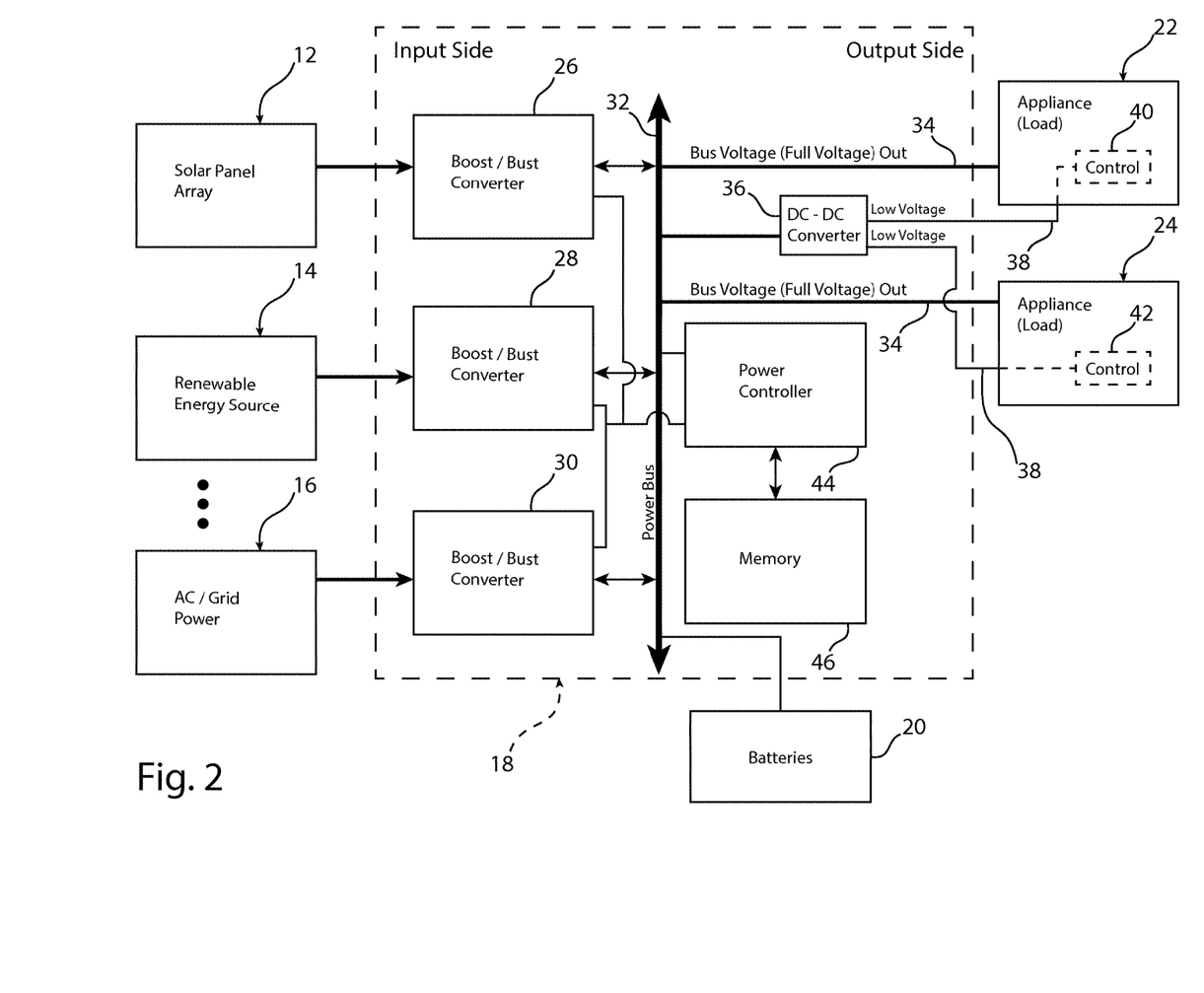
FIG. 2 is a schematic illustration of the components of the power controller of FIG. 1.

FIG. 2 is a schematic illustration of the power system 10 of FIG. 1 in more detail, showing the components of the power controller 18 in more detail. On the input side of the power controller 18, each of the power sources 12, 14, 16 is connected to an appropriate boost-to-bust converter 26, 28, 30. The boost-to-bust converters 26, 28, 30 are DC-DC converters that can output voltages and currents above or below the input voltage and current levels. If the input voltage is an AC voltage, a flyback converter or another suitable device may be used in lieu of a boost-to-bust converter, as it is in the illustration of FIG. 2. Generally speaking, the converters 26, 28, 30 serve to produce a consistent output voltage from each of the individual power sources 12, 14, 16. The outputs from the converters 26, 28, 30 go to a power bus 32.

The power bus 32 operates at a predefined voltage, which is typically the voltage needed to run the appliances or loads 22, 24. For example, if the appliance 22 is an air conditioner adapted to run at 48 VDC, the power bus 32 would be configured to operate at 48 VDC. On the output side of the power controller 18, full voltage power outputs 34 go to each of the appliances 22, 24. Additionally, the power controller 18 includes a DC-DC converter 36 that takes the voltage of the bus 32 and transforms it to a lower voltage, creating one or more low voltage outputs 38. The lower voltage may be used to power the control electronics 40, 42 of the appliances 22, 24, or for other purposes not requiring the full voltage of the power bus 32.

The power controller 18 also includes a controller 44 that controls the boost-to-bust converters 26, 28, 30 and the other components. The controller 44 may be a microprocessor in some embodiments. However, the full capabilities of a microprocessor may not be necessary in all embodiments, and in other embodiments, the controller 44 may be a field-programmable gate array (FPGA), an application-specific integrated circuit (ASIC) or any other type of device capable of performing the functions set forth in this description. As will be described below in more detail, the controller 44 sets the voltage and current limits and/or targets for the converters 26, 28, 30 and performs a number of other executive functions. The controller 44 is connected to a memory 46, which may be an electrically eraseable programmable read-only memory (EEPROM) or a flash memory, to name two potential options. The memory 46 allows for data logging and storage of actual performance data, among other functions.

It should be understood that FIG. 2 illustrates only the basic components of the power controller 18. In some embodiments, the power controller 18 may include interface components that allow it to display its performance characteristics or provide direct output to the user. Those interface components may, for example, include an LCD screen. In other embodiments, the interface components may include a network interface, such as a Wifi (IEEE 802.11a/b/g/n) transceiver or an Ethernet interface to allow the power controller 18 to communicate through a network such as the Internet.

Methods for Controlling Power Generation and Flow

Methods according to embodiments of the invention seek to maintain the condition of the batteries 20 while maximizing power output. In the case of lead-acid batteries, this generally means keeping the batteries 20 above a defined minimum level of charge unless it is possible to charge the batteries immediately after they fall below the defined minimum level of charge.

Figure 3:
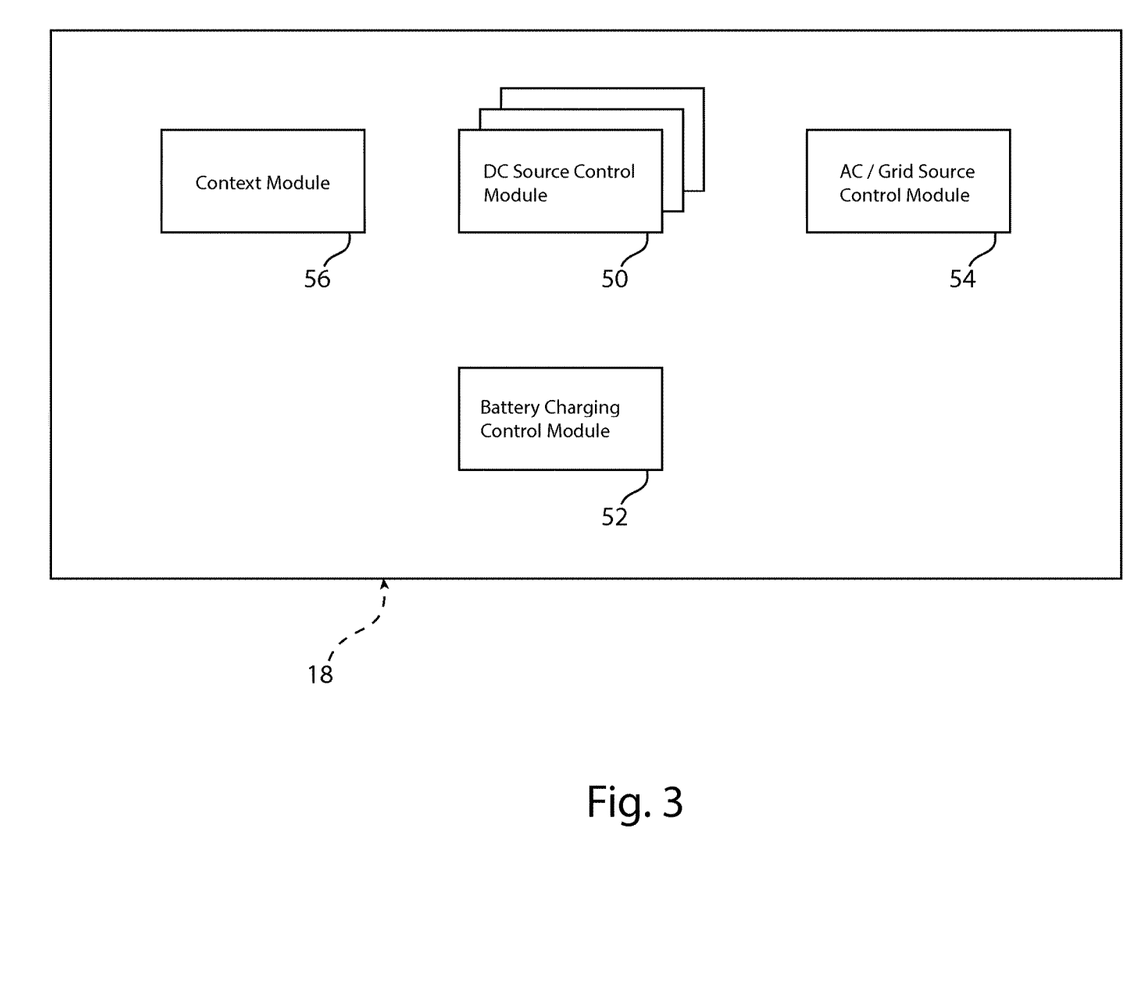
FIG. 3 is an illustration of the software modules that are executed by the power controller of FIG. 1.

FIG. 3 is a schematic diagram illustrating the various software modules implemented by the power controller 18. These software modules run on the power controller 18 and constitute machine-readable instructions on a machine-readable medium that cause the power controller 18 to execute functions that will be described in greater detail below.

More specifically, the power controller 18 implements a DC source control software module 50 for each DC source to which the power controller 18 is connected. Thus, as illustrated, there may be several DC source control software modules 50 operating in parallel. An AC/grid source control software module 54 is provided for the AC/power grid power source. Additionally, a battery charging control software module 52 controls battery charging. Finally, a context module 56 provides information on the environment in which the power controller 18 is installed. Depending on how these modules 50, 52, 54, 56 are implemented, they may communicate in various ways. If implemented in an object-oriented programming language, the modules 50, 52, 54, 56 may communicate by means of publicly available functions that can be called from any of the modules 50, 52, 54, 56. Alternatively, the modules 50, 52, 54, 56 may communicate by means of a shared memory space to which each function has read-write access to its own portions of the memory space and read-only access to the other portions of the memory space.

Figure 4:
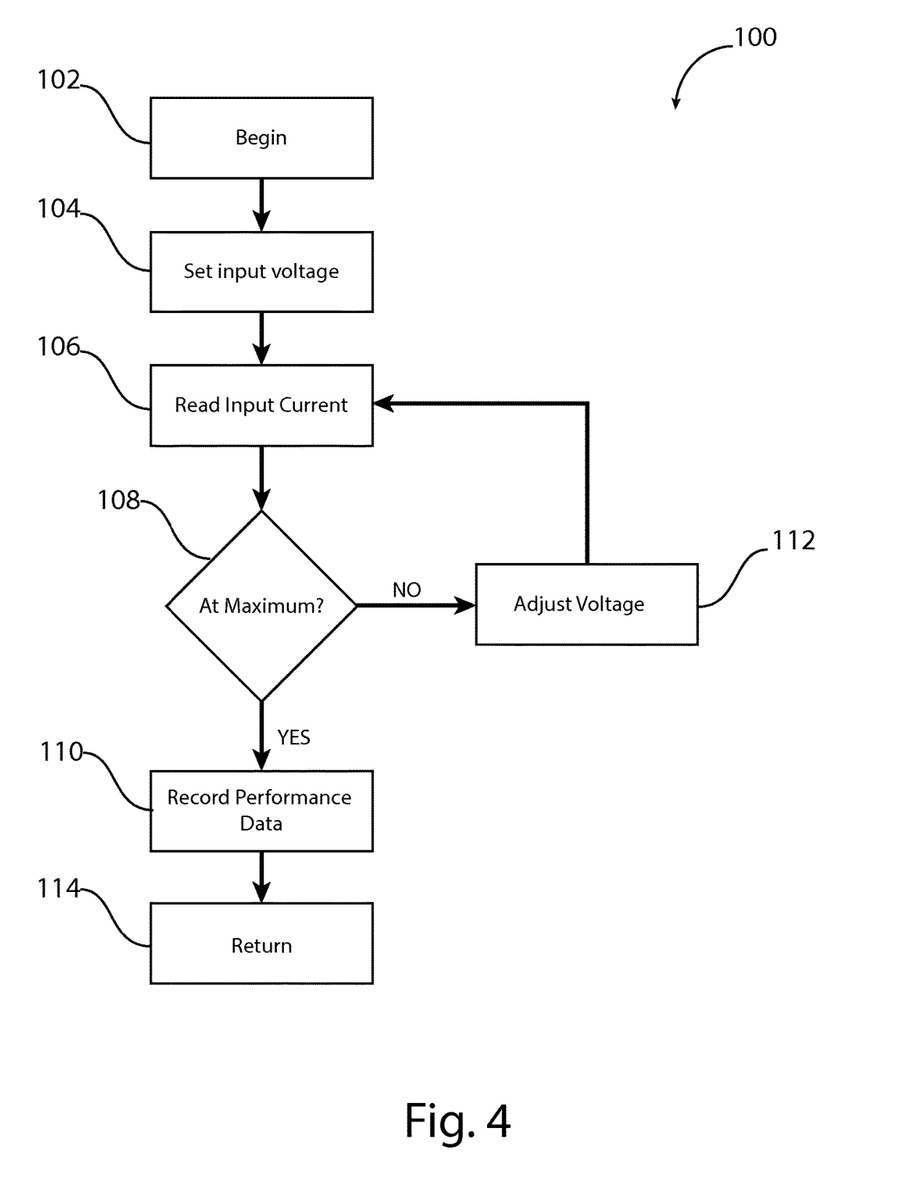
FIG. 4 is a flow diagram of a DC source control method executed by the power controller of FIG. 1.

FIG. 4 is a flow diagram of a method, generally indicated at 100, performed by the DC source control software module 50. As those of ordinary skill in the art will appreciate, the current-voltage relationship (i.e., the I-V curve) for a solar panel is nonlinear. For that reason, most conventional solar panel controllers implement some sort of maximum power point tracking (MPPT) algorithm to attempt to get the peak amount of power out of a solar panel. In some embodiments of the invention, the DC source control software module 50 may implement a conventional MPPT algorithm.

Several methods for MPPT exist, and if the DC source control software module 50 implements an MPPT algorithm, any of those algorithms may be used. One of the simplest and most common is the perturb-and-observe algorithm, in which the controller adjusts the voltage a small amount and measures the resulting power output. If the power goes up after a change to voltage, then the algorithm continues to change the voltage in the same direction until a drop is seen in the power output. The last voltage value at which an increase in power was seen is taken to be the peak power. The algorithm assumes that the I-V curve for the solar panel peaks and then declines. MPPT may be performed for an individual solar panel or for an entire solar panel array.

While a DC source control software module 50 controlling a solar panel may use a conventional MPPT algorithm, method 100 and other custom methods implemented by the module 50 preferably also use contextual information, from the context module 56 as well as from other sources, to make better assumptions about the amount of power that can be expected from a particular solar panel and from a solar panel array 12 as a whole. In some embodiments, a basic MPPT algorithm may be performed for a single solar panel, while a method like method 100 may be performed for a solar panel array 12 as a whole.

Method 100 begins at task 102 and continues with task 104. In task 104, the controller 44 sets an appropriate voltage for the boost-to-bust converter 26 connected to the solar panel array 12. The manner in which this is done, and the voltage level that is initially set in task 104 will depend on a number of factors. If this is the first time that task 104 has executed with a particular solar panel array 12 and no actual performance data is available, the controller 44 may be programmed with a specific initial voltage to use, e.g., based on the fill factor for the solar panels.

If this is not the first time that task 104 has been executed with a particular solar panel array 12, more information will typically be available with which to choose a voltage. For example, if the voltage has previously been set, the voltage set in task 104 in the next iteration of method 100 will typically be some interval from the last voltage. For example, the controller 44 might adjust the voltage 0.5 volts or 1 volt if this is the second or subsequent iteration of method 100.

In other situations, one or both of contextual information and past performance information may be used to set an initial voltage. For example, on a first iteration of method 100, and at regular intervals thereafter, the controller 44 might begin by querying the context module 56 and its routines to determine the time of day and the latitude. From this information, the controller 44 can determine first of all whether it is dark outside, in which case, it may interrupt method 100 and terminate it after task 104. If it is not dark outside, the controller 44 can use the time of day and latitude information to adjust the voltage level. In many embodiments, a look-up table or other form of data repository may be stored in the memory 46. This contextual information can be used as a guideline to adjust a theoretical voltage or power expected from the solar panel array 12.

As will be described below in more detail, the controller 44 also stores actual performance data, including set voltages and current/power levels at particular times of day. Thus, if this kind of performance data has been stored, the controller 44 might choose in task 104 to set the voltage equal to the voltage that achieved peak power at the same time of day the previous day, the previous week, or the same day the previous year. In task 104, the controller 44 may also be adapted to expect year-over-year solar panel degradation. In that case, the controller 44 may expect the solar panel array 12 to produce, e.g., 5% less power than on the same day in the previous year, and may use the previous year minus 5% as a starting point. Of course, task 104 sets only an initial voltage. Once a voltage is set, method 100 continues with task 106.

In task 106, having set a voltage, the controller 44 measures the output current and calculates the resulting power output of the solar panel array 12. Method 100 continues with task 108, a decision task.

In task 108, if the power output is at a peak (task 108: YES), method 100 continues with task 110. If the power output is not at a peak (task 108: NO), method 100 continues with task 112, and the voltage is incremented up or down. From task 112, method 100 returns to task 106 and the power output is measured again.

In task 110, the controller 44 records the peak power output in the memory 46, along with whatever other information is necessary, including the date and time of day. Method 100 then continues with and concludes at task 114.

As may be evident from the description above, the purpose of the context module 56 is to provide contextual information for the other modules 50, 52, 54. The nature of the contextual information will vary from embodiment to embodiment. At the most basic level, the context module 56 may access an internal clock to determine the time of day. Other contextual information that may be provided by the context module 56 includes the latitude and/or position of the power system 10, the total electrical load on the power system 10, the sunrise and sunset times for the location in which the power system 10 is installed, the number of daylight hours expected at the location, and the weather (e.g. overcast or sunny) for the location. In some embodiments, the performance characteristics of the solar panel array 12 that were described above, and the characteristics of the other power sources 14, 16, may also be stored and managed by the context module 56.

The latitude and/or position of the power system 10 may be input into the power controller 18 at the time the power system 10 is installed, as may other contextual information. In some cases, the input may be of the system's exact position, while in other cases, it may be sufficient if, for example, the installer selects the region in which the power system 10 is installed. Of course, if desired, a device like a GPS receiver may be included in the power controller 18 so that positional information can be acquired automatically without initialization.

In some embodiments, if the power controller 18 includes network connectivity, contextual information may be downloaded from a server over a network like the Internet. For example, the power controller 18 could automatically download sunrise and sunset times, weather data, and other information, either periodically or in real time. The routines of the context module 56 may update continuously, run at defined intervals, or run only when called by one of the other modules.

The AC/grid source control module 54 controls an AC source. The primary role of this module 54 is to determine when AC or grid power is available. If the AC/grid source control module 54 determines that AC or grid power is available, it may set a flag to indicate so. In most embodiments, it may be assumed that if AC or grid power is available, it will be used. However, in other embodiments, the AC/grid source control module 54 may be configured such that AC or grid power is only used in certain circumstances, such as during defined off-peak hours, or when extra power is needed to supplement the power from the solar panel array 12 or other renewable sources.

The battery charging control module 52 implements methods to maintain the batteries 20 in acceptable condition and to decide when sufficient power is available to allow the appliances 22, 24 to draw the batteries 20 down. The battery charging control module 52 may implement any of a number of different methods, depending on the type of batteries 20 and other factors.

Figure 5:
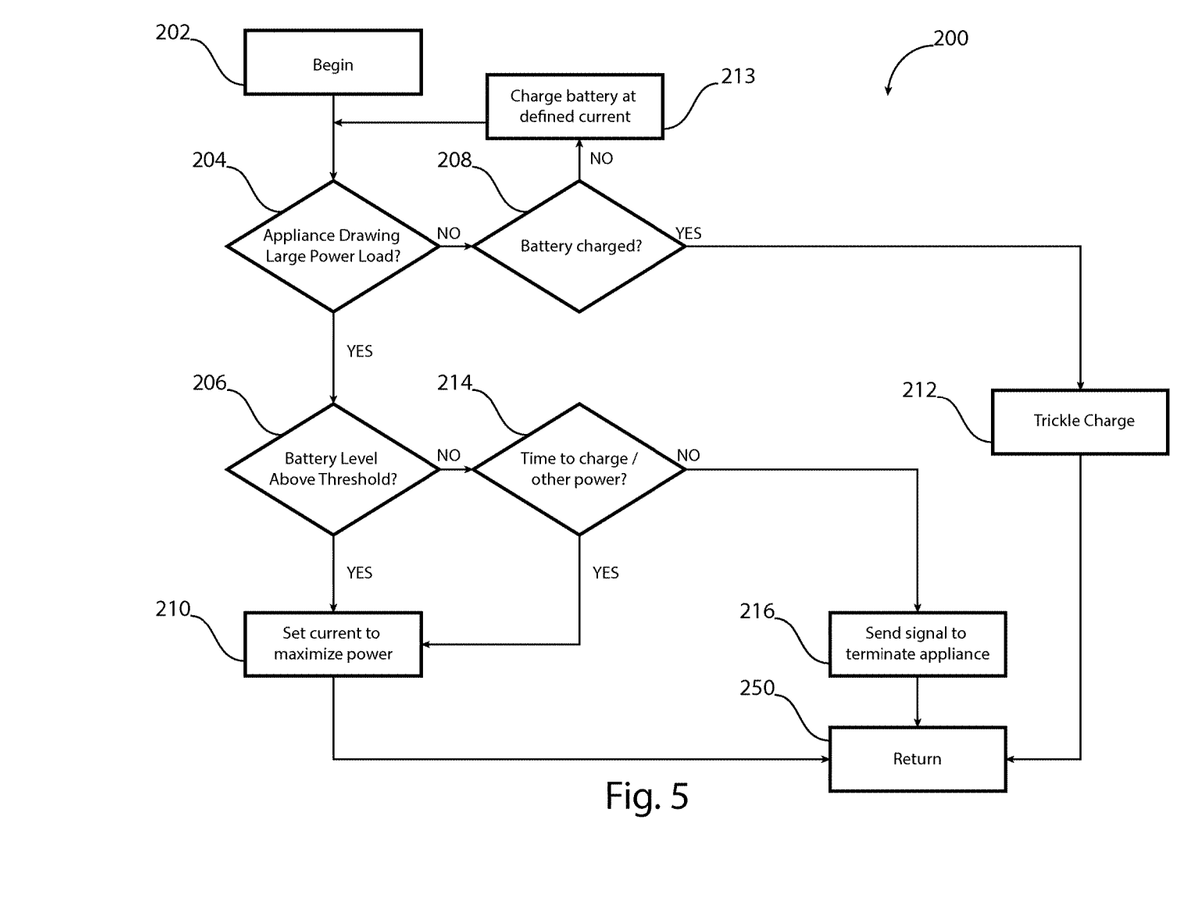
FIG. 5 is a flow diagram of a battery charging method executed by the power controller of FIG. 1.

One method for battery charging and control of power usage, generally indicated at 200, is illustrated in FIG. 5. Method 200 begins at 202 and continues with task 204, a decision task. In task 204, the controller 44 determines whether any of the appliances 22, 24 is drawing a large power load. Many appliances 22, 24 have modes in which they draw a large amount of power and modes in which they do not. As one example, an air conditioner would typically draw a large amount of power when its compressor is running, and a relatively low amount of power when only a blower is running Of course, if the appliances 22, 24 are off, they may draw only the power necessary to run their control electronics.

In task 204, if the appliances 22, 24 are drawing a large load (task 204: YES), method 200 continues with task 206. If the appliances 22, 24 are not drawing a large load (task 204: NO), method 200 continues with task 208.

In task 206, having already established that a relatively large amount of power is currently needed for the appliances 22, 24, the controller 44 next determines whether the batteries 20 can and should supply that power. Specifically, in task 206, a decision task, the controller 44 determines whether the levels of the batteries 20 are above a pre-set threshold. As was noted briefly above, for lead-acid batteries, that threshold may be, for example, 50% of their rated charge. If the batteries 20 are above the pre-defined threshold (task 206: YES), the controller 44 sets the current to maximize the power output to the appliances 22, 24 in task 210 before terminating and returning at task 250.

If the appliances 22, 24 are not currently drawing a large power load (task 204: NO), method 200 continues with task 208, another decision task. When method 200 reaches task 208, the controller 44 has essentially determined that the batteries 20 are the only load on the system. Thus, in task 208, the controller 44 determines whether the batteries 20 are charged. This can often be done by checking the voltage on the batteries 20. If, for example, the batteries 20 are designed to operate at a voltage of 48V and they are at 52-53V, that is an indication that the batteries 20 are charged. If the batteries are charged (task 208: YES), method 200 continues with task 212 and the batteries 20 are charged at an appropriate trickle charge to maintain their levels of charge. After task 212, method 200 terminates and returns at task 250.

If the batteries 20 are not charged (task 208: NO), method 200 continues with task 213 and the batteries are charged at a defined current. Typically, batteries are charged at a current of about 10% of their rated capacity. Thus, a battery with a 100 Amp hr capacity would typically be charged with 10 Amps of current. However, in some embodiments, the controller 44 may use a variable charging rate.

In the final case of method 200, after task 206: NO, the controller 44 has determined that the appliances 22, 24 are drawing a large load of power, but the batteries 20 are below their threshold charge value. In that case, method 200 continues with task 214, another decision task. In task 214, the controller 44 determines whether or not there is sufficient time to charge the batteries 20 if they are used to power the appliances 22, 24. This decision task involves obtaining information from the context module 56 on at least the time of day, the availability of AC or grid power and/or other power sources, and, if available, the number of daylight hours remaining. In task 214, or in tasks associated with task 214, the controller 44 uses the contextual information, along with information on available power sources, to determine whether there is sufficient power from other sources to recharge the batteries 20 if they are used to power the appliances 22, 24 despite their low charge levels.

In several cases, the controller 44 may allow the batteries 20 to be used despite battery charge levels below the threshold. For example, if AC or grid power is available, it can be used to charge the batteries regardless of the time of day. If more than one renewable energy source is available and at least one can be used to charge the batteries 20 irrespective of the time of day, the controller 44 may also allow the batteries 20 to be used. Finally, if only solar power is available but it is morning and ample daylight hours remain, the controller 44 may allow the batteries 20 to be used. In those cases, control of method 200 returns to task 210 and the current and voltage are set to maximize power output to the appliances 22, 24.

Of course, there will be situations in which the charge of the batteries 20 is below the threshold level and sufficient power to recharge them is not available. In those circumstances, some conventional power systems might simply allow the batteries to run down powering the appliances 22, 24. If that were to happen, however, the batteries 20 might be permanently damaged, particularly if they are lead-acid batteries. Thus, if sufficient charging power is unavailable in task 214 (task 214: NO), a signal is sent to terminate the activity of the appliance in task 216 before method 200 terminates and returns in task 250. On the other hand, if sufficient charging power is available or there is sufficient time to charge (task 216: YES), method 200 returns to task 210 and the current and voltage are set to maximize power output to the appliances 22, 24.

In some embodiments, the termination of task 216 may be accomplished simply by cutting power to the appliances 22, 24 or to the outlets to which they are connected. However, in some embodiments, the appliances 22, 24 may be particularly adapted to communicate with the power controller 18, such that the power controller 18 can send a signal to the appliances 22, 24 for a soft shutdown. In embodiments in which the power controller 18 communicates directly with the appliances 22, 24, instead of a complete shutdown, it may be possible in some circumstances to allow a partial shutdown in which, for example, an air conditioner's fan may be operational, but not the compressor.

The algorithm implemented by method 200 is intended to prevent the batteries 20 from being fully depleted by operation of the appliances 22, 24. As was noted above, this kind of algorithm is particularly useful for lead-acid batteries, which may sustain damage if they are completely drained. However, the power system 10 may be used with other kinds of batteries, and with those kinds of batteries, there may be other battery management algorithms implemented by the power controller. For example, using batteries that are susceptible to the memory effect, like lithium ion batteries, the controller 44 may implement a method that periodically completely drains the batteries and recharges them periodically, which tends to counteract the memory effect. In that case, the battery management algorithm may allow the appliances 22, 24 to completely drain the batteries when power is not available to recharge them.

Most solar power control systems use fuses for safety purposes, to protect connected appliances from power surges. One advantage of power system 10 and methods like method 200 is that while typical fuses may be installed, it may not be necessary to rely on them to the extent that one would with a conventional system, because the power system 10 controls the power output and battery charge.

In use, the power system 10 controls the generation and flow of power, and may take contextual information, like the time of day, into account in doing so. The appliances 22, 24 that are connected to the power system 10 may also have their own power conservation and convenience features. For example, an air conditioner used with the power system 10 may be equipped with a programmable thermostat that engages the air conditioner only at programmed times of day. The appliances 22, 24 may also be network-connected so that, for example, a user can activate the appliances 22, 24 or program them to activate from a World Wide Web page or an application running on a computer or a mobile device. Of course, other types of interfaces may also be provided for the appliances 22, 24, including remote controls, multiple thermostats, and interfaces that allow the appliances 22, 24 to integrate with other appliances and systems.

As was noted briefly above, the power system 10 itself may be network-connected and may provide an interface, either on the power controller 18 or accessible via a World Wide Web page or on an application running on a computer or a mobile device, that allows a user to monitor the power system 10. In some cases, an interface may be provided that displays the status of both the power system 10 and the appliances 22, 24 and allows a user to control both of them.

In the description above, methods like method 200 provide strict control over the battery charging and the conditions under which the appliances 22, 24 are permitted to run at full power. However, if an appropriate interface is provided, a user may be permitted to override certain decisions made by the power controller 18, for example, to allow an appliance 22, 24 to run despite low battery charge. In that case, a user would typically be warned of the consequences of such a decision, and the power controller 18 may cut power to the appliances 22, 24 at a second, lower threshold.

While the invention has been described with respect to certain embodiments, the description is intended to be exemplary, rather than limiting. Modifications and changes may be made within the scope of the invention.

What is claimed is:

1. A solar power generation system, comprising:
   at least one solar panel;
   a battery;
   one or more appliances;
   at least one contextual sensor; and
   a controller connected to and between the at least one solar panel, the battery, and the one or more appliances, the controller being adapted to implement
      a maximum power point tracking (MPPT) algorithm for the at least one solar panel, the MPPT algorithm being configured to maximize a power output of the at least one solar panel,
      a battery charge algorithm that directs power from the at least one solar panel to maintain a charge of the battery at at least a defined charge threshold, and
      a contextual power draw and charging algorithm that derives a contextual power indicator from the at least one contextual sensor and allows the battery to be drawn down beyond the defined charge threshold if the contextual power indicator indicates that sufficient power is or will be available from the at least one solar panel to recharge the battery.

2. The solar power generation system of claim 1, wherein the contextual power indicator comprises an indication of the number of daylight hours remaining.

3. The solar power generation system of claim 2, wherein the contextual sensor comprises a clock.

4. The solar power generation system of claim 3, wherein the controller further comprises a memory.

5. The solar power generation system of claim 4, wherein the memory contains system location information and the controller is adapted to use input from the clock and the location information in deriving the indication of the number of daylight hours remaining.

6. The solar power generation system of claim 1, wherein the controller further comprises:
   a power bus; and
   a boost-to-bust converter connected between the at least one solar panel and the power bus, the boost-to-bust converter bringing a voltage supplied by the at least one solar panel to a bus voltage of the power bus.

7. The solar power generation system of claim 1, wherein the battery comprises a lead-acid battery.

8. The solar power generation system of claim 1, further comprising an alternating current or grid power source connected to the controller;
   wherein the controller derives the contextual power indicator at least in part by considering the status of the alternating current or grid power source.

9. A method for controlling solar power generation and resultant energy output using a controller, comprising:
   performing a maximum power point tracking algorithm on a solar panel or a solar panel array to maximize a power output of the solar panel or the solar panel array;
   charging a battery using power developed from the solar panel or solar panel array to maintain the battery at at least a defined charge threshold;
   deriving a contextual indicator of available power and, under an electrical load from one or more appliances, allowing the battery to be discharged below the defined charge threshold only if the contextual indicator of available power indicates that sufficient power is or will be available to charge the battery.

10. The method of claim 9, wherein the contextual indicator of available power comprises an indication of daylight hours remaining for a location in which the method is being performed.

11. The method of claim 9, further comprising signaling the appliance to shut down if the battery is below the defined charge threshold and the contextual indicator of available power indicates that sufficient charge is not or will not be available to charge the battery.

12. The method of claim 11, wherein the appliance is a direct current (DC) appliance.

13. The method of claim 12, wherein the appliance is a DC air conditioning system.

14. The method of claim 9, wherein the MPPT algorithm is a perturb-and-observe algorithm.

15. The method of claim 9, wherein the contextual indicator is further derived from one or more of: a time of day; a latitude of the controller; a location of the controller; an electrical load; a number of daylight hours expected at the location of the controller; or the weather at the location of the controller.

16. The method of claim 15, further comprising choosing an initial voltage for the MPPT algorithm based on the contextual indicator.

17. The method of claim 9, further comprising accepting power from one or more grid power sources;
   wherein the contextual indicator further comprises an indication of an availability and status of the one or more grid power sources.

18. The method of claim 9, further comprising, if the battery is charged, maintaining the battery with a trickle charge.

19. The method of claim 9, wherein the battery comprises a lead-acid battery.

* * * * *